United States Patent
Fattaruso et al.

(10) Patent No.: US 6,222,474 B1
(45) Date of Patent: Apr. 24, 2001

(54) RESISTOR STRING DIGITAL-TO-ANALOG CONVERTER WITH BOOSTED CONTROL BASED ON DIFFERENTIAL INPUT BETWEEN SUCCESSIVELY RECEIVED INPUT WORDS

(75) Inventors: John W. Fattaruso, Dallas, TX (US); Shivaling S Mahant-Shetti, Karnataka (IN)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/386,260

(22) Filed: Aug. 31, 1999

(51) Int. Cl.[7] ............................................ H03M 1/66
(52) U.S. Cl. ................................. 341/154; 341/144
(58) Field of Search ................................. 341/144, 154

(56) References Cited

U.S. PATENT DOCUMENTS

| | | | |
|---|---|---|---|
| 4,684,922 | * 8/1987 | Minogue | 341/144 |
| 5,307,064 | * 4/1994 | Kudoh | 341/144 |
| 5,534,862 | 7/1996 | Gross, Jr. et al. | 341/144 |
| 6,127,957 | * 10/2000 | Fattaruso et al. | 341/154 |
| 6,157,335 | * 12/2000 | Suzuki et al. | 341/154 |

\* cited by examiner

*Primary Examiner*—Howard L. Williams
(74) *Attorney, Agent, or Firm*—Ronald O. Neerings; Frederick J. Telecky, Jr.

(57) ABSTRACT

A digital to analog converter ("DAC") (20). The DAC includes an input (23) for receiving a plurality of successive digital words ($D_3$–$D_0$), and circuitry (28, 30) for storing the plurality of successive digital words. The DAC also includes a string (12') of series connected resistive elements, wherein the string comprises a plurality of voltage taps (T0'–T15'). The DAC further includes an output ($OUT_A$) for providing an analog output voltage corresponding to a selected one of the plurality of successive digital words. The DAC further includes comparison circuitry (32) for comparing the selected one and an earlier received one of the plurality of successive digital words. Finally, the DAC includes circuitry (34, 24, 26) for generating the analog output voltage in response to the comparison circuitry.

39 Claims, 5 Drawing Sheets

RESISTOR STRING DIGITAL-TO-ANALOG CONVERTER WITH BOOSTED CONTROL BASED ON DIFFERENTIAL INPUT BETWEEN SUCCESSIVELY RECEIVED INPUT WORDS

CROSS-REFERENCES TO RELATED APPLICATIONS

Not Applicable.

STATEMENT REGARDING FEDERALLY SPONSORED RESEARCH OR DEVELOPMENT

Not Applicable.

BACKGROUND OF THE INVENTION

The present embodiments relate to digital-to-analog converters, and are more particularly directed to converters using resistor strings.

A digital-to-analog converter ("DAC") may be used in various types of electronic circuits, or itself may be formed in a single integrated circuit device. In operation, the DAC is used to convert an input digital signal to an output analog signal, typically where the amplitude of the output analog signal corresponds directly to the magnitude of the input digital signal. For further background, a DAC illustrated as having a resistor string in a single dimension may be seen in co-pending U.S. patent application Ser. No. 09/342,878, entitled "Bit Interpolation In A Resistor String Digital-To-Analog Converter", filed Jun. 29, 1999, having the same inventors as the present application, and hereby incorporated herein by reference. However, the embodiments of this application pertain more favorably to a DAC having a meander resistor string and, thus, a description of a prior art system with such a string is described as further background immediately below.

Figure 1:
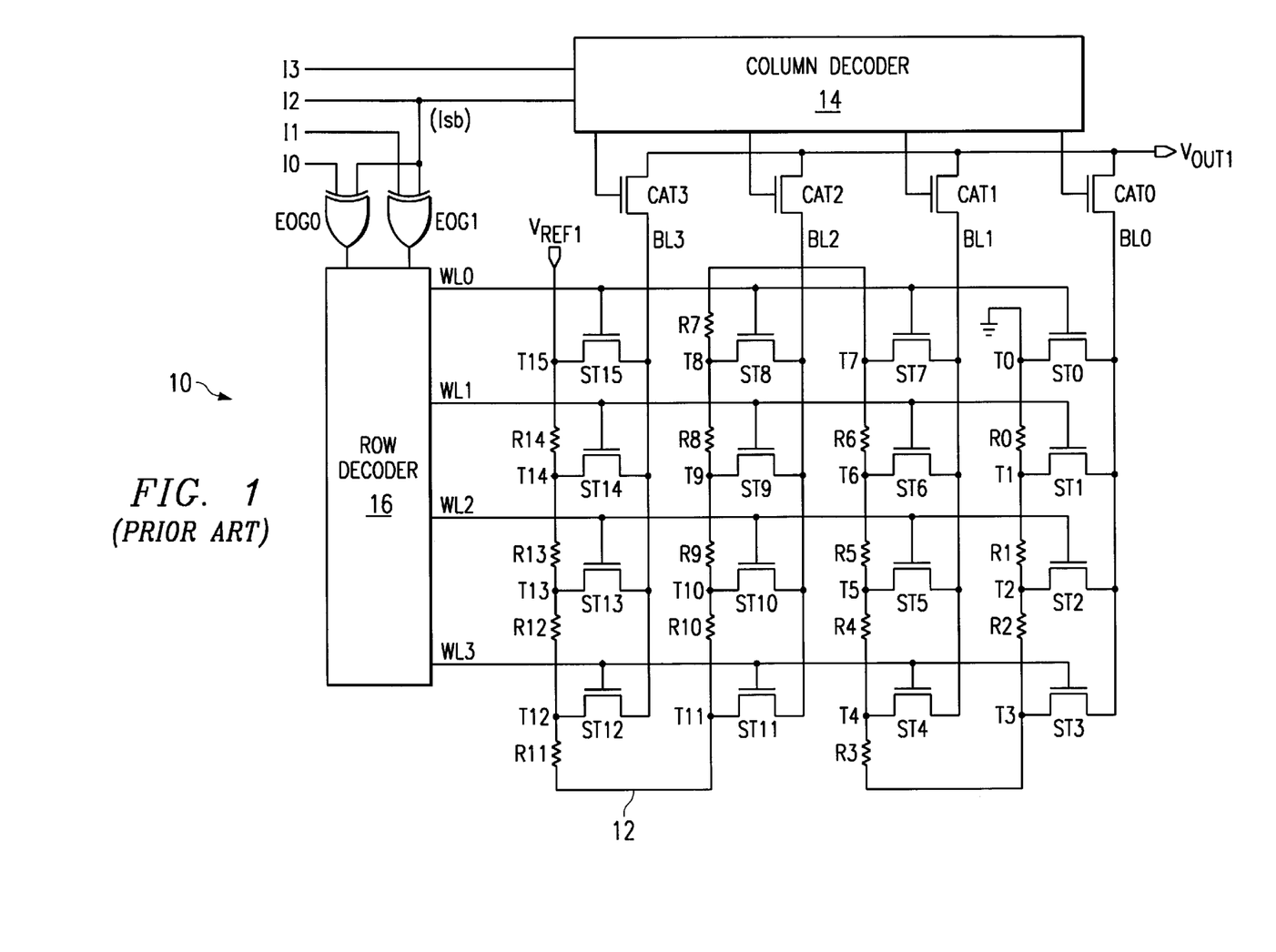
FIG. 1 illustrates a schematic of a prior art digital-to-analog converter ("DAC")

FIG. 1 illustrates a typical configuration of a prior art DAC 10, and is detailed briefly here with additional understandings left to one skilled in the art. By way of example and as appreciated later, DAC 10 is a 4-input 16-output DAC, while numerous other dimensions may exist for different DAC configurations. In general and as detailed below, DAC 10 is operable to receive a 4-bit input word, designated from least significant bit to most significant bit as I0–I3, and in response to the magnitude of that input, to output a corresponding analog voltage. Before detailing this operation, it is first instructive to examine the devices and connections of DAC 10. In this regard, DAC 10 includes a series-connected resistor string designated generally at 12, and which forms a meander in that it serpentines back and forth. Additionally, DAC 10 is generally an array in nature, having a number of bit lines in the vertical dimension and a number word lines in the horizontal dimension. Since the example of DAC 10 presents a 4-input 16-output DAC, the array of DAC 10 includes four bit lines designated BL0 through BL3, and four word lines designated WL0 through WL3. Also for the current example of a 4-to-16 DAC, resistor string 12 includes fifteen resistive elements shown as R0 through R14. Resistive elements R0 through R14 may be formed using various techniques, where the particular technique is not critical to the present inventive teachings. Also in this regard, in an effort to maintain the linearity between the digital input and the analog output, a common concern in the art is to endeavor to ensure that each resistor in the string has as close to the same resistance value as all other resistors in the string. Moreover, a voltage source $V_{REF1}$ is applied across resistor string 12, and may be of any suitable biasing voltage, which for current applications is typically on the order of 2 to 5 volts. In any event, given the equal resistance of each element in the string, the voltage division across the resistors is uniform.

Looking to the detailed connections with respect to the resistive elements in string 12, each resistive element provides two taps from which a voltage may be measured as detailed below. For example, looking to resistive element R0, it provides a tap T0 and a tap T1, while resistive element R1 shares the same tap T1 and provides another tap T2, and so forth. Each tap has a switching device connected between it and a corresponding output bit line. In the current example, each of these switching devices is an n-channel field effect transistor, and is labeled for convenience by combining the abbreviation ST (i.e., switching transistor) with the same numeric identifier corresponding to the tap to which the drain of the transistor is connected. For example, the drain of transistor ST0 is connected to tap T0, the drain of transistor ST1 is connected to tap T1, and so forth. Further, the switching transistors are arranged so that a like number of taps are coupled via corresponding switching transistors to a corresponding one of the bit lines. In the current example of DAC 10, four taps are coupled in this manner to a corresponding bit line. For example, taps T0 through T3 are coupled, via corresponding switching transistors ST0 through ST3, to bit line BL0. As another example, taps T4 through T7 are coupled, via corresponding switching transistors ST4 through ST7, to bit line BL1. Moreover, each bit line BL0 through BL3 is coupled via a respective column access transistor, CAT0 through CAT3, to a column decoder 14. More particularly and for reasons evident below, column decoder 14 is coupled to receive the two most significant bits (MSBs) of the 4-bit word input to DAC 10, and in response column decoder 14 controls the gates of column access transistors CAT0 through CAT3.

Returning now to switching transistors ST0 through ST15, and given the array nature of DAC 10, it is further appreciated that the switching transistors are arranged so that a like number of switching transistors are controlled, via connection to their gates, by a corresponding word line which is further connected to row decoder 16. In the current example of DAC 10, four switching transistors are coupled in this manner to a corresponding word line. For example, the gates of switching transistors ST0, ST7, ST8, and ST15, are coupled to word line WL0. As another example, the gates of switching transistors ST1, ST6, ST9, and ST14, are coupled to word line WL1. Lastly in this regard, and for reasons evident below, row decoder 16 is coupled to receive the two least significant bits (LSBs) of the 4-bit word input to DAC 10 (i.e., bits I1 and I0), and also the least significant bit ("lsb") of the 2 MSBs input to column decoder 14 (i.e., bit I2). In response to these bits, row decoder 16 controls the gates of switching transistors ST0 through ST15. More particularly, each least significant bit I0 and I1 is coupled as an input to a corresponding exclusive OR gate EOG0 and EOG1 as a first input, while the second input of exclusive OR gates EOG0 and EOG1 is connected to receive the least significant bit of the MSBs input to column decoder 14.

The operation of DAC 10 is now described, first in general and then more specifically through the use of a few examples. A 4-bit digital word is connected to inputs I0 through I3 and, ultimately causes signals to pass to column decoder 14 and row decoder 16. Generally, row decoder 16 includes sufficient logic circuitry or the like to respond by enabling one of word lines WL0 through WL3, thereby providing an enabling voltage to the gates of the four switching transistors coupled to the enabled word line. Similarly, column decoder 14 includes sufficient logic circuitry or the like to respond by enabling one of column access transistors CAT0 through CAT3, thereby causing the enabled transistor to pass the voltage from the corresponding one of bit lines BL0 through BL3 to output $V_{OUT1}$. In a simple case, the result of the above operations may be viewed by correlating the value of the 4-bit input to one of the sixteen decimal tap numbers. For example, if the 4-bit digital word equals 0001 (i.e., decimal value 1), then through enabling a switching transistor and a column access transistor the voltage at tap T1 is coupled to $V_{OUT1}$.

By way of detailed illustration of the operation of DAC 10, the example of an input equal to 0001 is now traced through DAC 10 in greater detail. From the input of 0001, its two MSBs are coupled to column decoder 14 and, thus, the value of 00 is received by column decoder 14. In response, column decoder 14 enables the gate of the column access transistor having a numeric identifier equal to the value of the MSBs. Here, the MSBs of 00 equal a decimal value of 0 and, thus, column decoder 14 enables the gate of column access transistor CAT0. Turning now to row decoder 16, it responds to the value of the two MSBs of the 4-bit input. However, note that these two MSBs pass through exclusive OR gates and, therefore, their values are unchanged when passed to row decoder 16 if the lsb equals 0, or their complements are passed to row decoder 16 if the lsb equals 1. Returning then to the example of a 4-bit input equal to 0001, the LSBs equal 01, and the lsb equals 0. Thus, the value of 01 is unchanged and reaches row decoder 16, and it enables the word line having a decimal numeric identifier equal to the value of the LSBs as received from gates EOG0 and EOG1. In the present example, therefore, row decoder 16 enables word line WL1 which, therefore, enables each of switching transistors ST1, ST6, ST9, and ST14. Recall also that column decoder 14 in this example enables column access transistor CAT0. As a result, the voltage from tap T1 passes via switching transistor ST1 to bit line BL0, and then passes via column access transistor CAT0 to $V_{OUT1}$. Lastly, it is noted that the voltage at tap T1 is divided across one resistive element (i.e., R0) and, thus, for an input equal to 0001, the analog output voltage using voltage division is $1/15 * V_{REF1}$.

To further illustrated in detail the operation of DAC 10, consider now the example of an input equal to 0111 as traced through DAC 10. At the outset, from the general operation described above, one skilled in the art will expect that since the decimal value of 0111 equals seven, then the tap selected by DAC 10 for output is tap T7. This expectation is now confirmed through a detailed examination of this example. From the input of 0111, its two MSBs of 01 are coupled to column decoder 14. In response, column decoder 14 enables the gate of the column access transistor having a decimal numeric identifier equal to the MSB values of 01 and, hence, the gate of column access transistor CAT1 is enabled. Turning now to row decoder 16, note first that the lsb of the MSBs in this example equals 1; consequently, gates EOG0 and EOG1 cause the complements of the LSBs to reach row decoder 16. Thus, the complements of the 11 LSBs are 00 and, therefore, the value of 00 reaches row decoder 16. In response, row decoder 16 enables word line WL0 since it has a numeric identifier equal to the value of the complemented LSBs. When word line WL0 is enabled, it enables each of switching transistors ST0, ST7, ST8, and ST15. Recall also that column decoder 14 in this example enables column access transistor CAT1. As a result, the voltage from tap T7 passes via switching transistor ST7 to bit line BL1, and then passes via column access transistor CAT1 to output $V_{OUT1}$. Lastly, it is noted that the voltage at tap T7 is divided across seven of the fifteen resistive elements (i.e., R0 through R6) and, thus, for an input equal to 0111, the analog voltage output using voltage division is equal to $7/15 * V_{REF1}$. Accordingly, the digital input of 0111 has been converted to an analog voltage which equals this divided voltage. Given this as well as the preceding example, one skilled in the art will further appreciate that with different digital inputs, any of the switching transistors of DAC 10 may be enabled followed by enabling one of the column access transistors, and for each such combination of transistors there is a corresponding output which represents a divided voltage between 0 volts or any value incrementing up from 0 volts by $1/15_{VREF1}$ and up to an output equal to $V_{REF1}$.

The configuration of DAC 10 has been accepted in various contexts; however it also provides certain drawbacks. Particularly, the speed of the DAC may limited due to various circuit features. For example, the circuit includes various elements which impose capacitance and, hence, delay, on the time that is required for a tap voltage to charge the output. Specifically, such capacitance exists in the bit lines as well as in the access transistors. In addition, although not shown in FIG. 1, the output $V_{OUT1}$ is typically connected to drive a sampling capacitor, where that capacitor provides an input to an amplifier for amplifying the DAC output. Naturally, this sampling capacitor also adds capacitance and consequential delay to the tap voltage. The delays arising from the above as well as from other aspects ascertainable by one skilled in the art may present difficulties, or may not be acceptable, in certain contexts. For example, some applications require DACs with rather large precision and operating at certain speeds. For example, digital audio applications require DACs with 16 bit precision and operating at a rate of at least 44 KHz. Thus, the preceding limitations may be critical given these or even greater circuit requirements. Still further, while increasing DAC speed is important, it is also often important for the DAC to be formed within a certain spatial area. In other words, while large bit precision and/or fast transition may be required, this often must be sought while also accommodating space constraints. Indeed, it is often the goal of an integrated circuit to be made smaller, and this goal may well apply to a DAC, either alone or in combination with other circuitry on the same single integrated circuit. With respect to the DAC, reducing its size is like to improve the linearity between the digital input and the analog output. In view of these drawbacks and goals, there arises a need to provide an improved DAC configuration, as is achieved by the preferred embodiments discussed below.

BRIEF SUMMARY OF THE INVENTION

In the preferred embodiment, there is a digital to analog converter ("DAC"). The DAC includes an input for receiving a plurality of successive digital words, and circuitry for storing the plurality of successive digital words. The DAC also includes a string of series connected resistive elements, where the string comprises a plurality of voltage taps. The DAC further includes an output for providing an analog output voltage corresponding to a selected one of the plurality of successive digital words. The DAC further includes comparison circuitry for comparing the selected one and an earlier received one of the plurality of successive digital words. Finally, the DAC includes circuitry for generating the analog output voltage in response to the comparison circuitry. Other circuits, systems, and methods are also disclosed and claimed.

DETAILED DESCRIPTION OF THE INVENTION

FIG. 1 was described in the preceding Background Of The Invention section of this document and in connection with the prior art.

Figure 2:
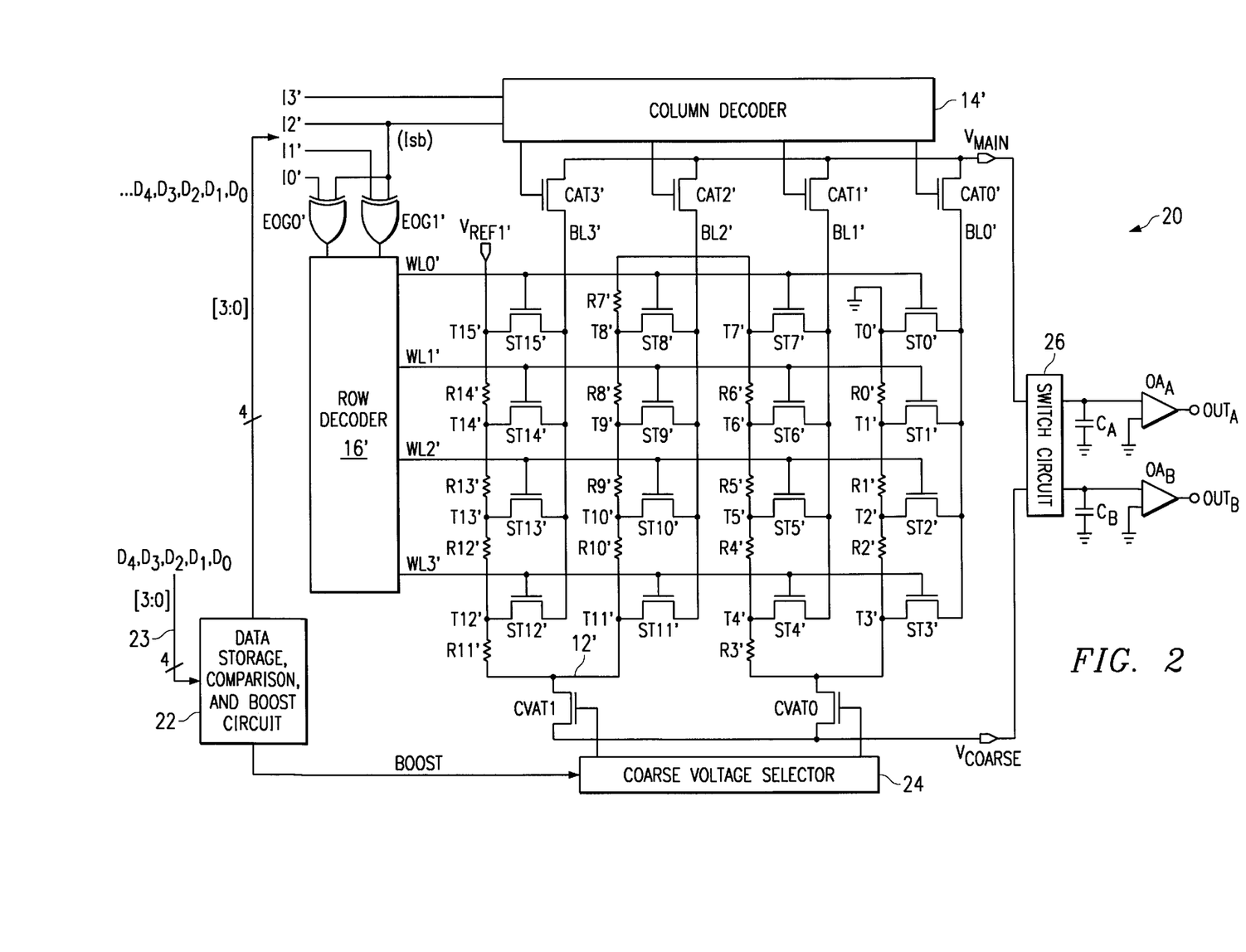
FIG. 2 illustrates a schematic and block diagram of an inventive DAC having a dual output, circuitry for storing and comparing successive digital input words, and circuitry for providing a responsive short-term boosted output charge signal to provide a faster settling time for each dual output.

FIG. 2 illustrates a schematic of a DAC 20 according to a first inventive embodiment DAC 20 includes many components that are comparable in connection and operation to components in DAC 10 of FIG. 1. To illustrate these like components, they are shown with the same reference identifiers as in FIG. 1, with the exception that an apostrophe is added to the identifier in FIG. 2. Briefly reviewing these comparable elements of DAC 20, and assuming the reader is familiar with DAC 10, DAC 20 is a 4-to-16 DAC that receives a 4-bit input word I0'–I3'. DAC 20 includes a series-connected resistor string 12' in the form of a meander having fifteen resistive elements R0' through R14', formed by one of various techniques such as those known in the art and with an effort to ensure like resistance for each element. The ends of the resistive elements give rise to an array of corresponding taps T0' through T15', biased in total by a reference voltage $V_{REF1'}$, and where that reference voltage is divided evenly across the taps. DAC 20 further includes a number of bit lines BL0' through BL3' as well as a number of word lines WL0' through WL3'. Each word line is connected to enable four corresponding switching transistors, thereby providing a total of sixteen such transistors ST0' through ST15'. Each bit line is accessed by a corresponding one of column access transistors CAT0' through CAT3'. More specifically, in one respect electrical access to a given tap voltage is achieved by row decoder 16' enabling a word line to enable its corresponding switching transistors, and column decoder 14' enables a gate of one of the column access transistors such that the tap voltage passes through a switching transistor to a bit line, and then through the enabled column access transistor to an output $V_{MAIN}$. Decoders 14' and 16' respond to bits I0'–I3' of the digital input word in the same general manner as DAC 10, whereby the two MSBs control column decoder 14' and the two LSBs, along with the lsb of the MSBs, control row decoder 16' in combination with the logic provided by exclusive OR gates EOG0' and EOG1'. Lastly and for purposes of later contrast, note that unlike the prior art output $V_{OUT1}$, $V_{MAIN}$ is neither the sole nor the final analog output for DAC 20.

While one skilled in the art will appreciate that the preceding discussion of DAC 20 is comparable to DAC 10, the operation and structure set forth thus far is greatly enhanced by additional circuitry shown in FIG. 2. Before detailing these differences, it is first noted that DAC 20 is shown as a 4-bit DAC for purposes of comparison to DAC 10 of the prior art; however, as will be appreciated by the conclusion of this document, the present inventive aspects may be readily implemented in a DAC having a larger number of inputs and, hence, having a larger number of other components to accommodate those inputs (e.g., resistive elements, voltage taps, word lines, bit lines, and so forth). By way of introduction now to DAC 20, its additional circuitry includes a data storage, comparison, and boost circuit 22, a coarse voltage selector 24 and its related coarse voltage access transistors CVAT0 and CVAT1, a switch circuit 26, and op amps $OA_A$ and $OA_B$. Each of these additional circuits is discussed below.

Data storage, comparison, and boost circuit 22 is named as such based on three of its functions, which are briefly noted here in relation to circuit connections and which are presented later in greater detail. First, circuit 22 receives and stores a series of incoming data words on an input 23, where these words are shown by way of example in FIG. 2 as $D_0$ through $D_4$. Second, once a sufficient number of data words are received (e.g., four words), circuit 22 makes comparisons between certain ones of those words where, in the preferred embodiment, the comparison is between every other word (e.g., $D_2$ and $D_0$, or $D_3$ and $D_1$). Third, and based on that comparison, circuit 22 provides a resulting boost signal BOOST to a coarse voltage selector 24. Circuit 22 also sequentially provides its received data to the inputs to column decoder 14' and exclusive OR gates EOG0' and EOG1'.

Coarse voltage selector 24 may be constructed in various manners to achieve the functionality described in detail below. Briefly summarizing that functionality here by way of introduction, coarse voltage selector 24 responds to the BOOST signal from circuit 22 by enabling one of the accessible coarse voltage access transistors; in the case of DAC 20, which recall is a 4-bit DAC, then for reasons understood later there are two such coarse voltage access transistors CVAT0 or CVAT1 are accessible by coarse voltage selector 24, and either of those may be enabled by presenting an enabling voltage to the gate of one of those transistors. The drain of transistor CVAT0 is connected to tap T3' and the drain of transistor CVAT1 is connected to tap T1'. The sources of coarse voltage access transistors CVAT0 and CVAT1 are connected to a coarse voltage output, $V_{COARSE}$ and, thus, $V_{COARSE}$ may be one of two voltages corresponding to the drain voltages of coarse voltage access transistors CVAT0 and CVAT1. However, given the connections of coarse voltage access transistors CVAT0 and CVAT1, recall that it was noted above that when implementing the present inventive aspects in a larger DAC, then various items in FIG. 2 may increase in number. The coarse voltage access transistors are yet another example of such a device which would appear in greater number for a larger DAC. For example, in a symmetric 16 bit DAC having 256 bit lines, then an implementation within the inventive scope would be to include a coarse voltage transistor for each pair of those bit lines, thereby giving rise to a total of 128 coarse voltage transistors, each coupled to be enabled by coarse voltage selector 24 and for coupling a voltage selected location along the resistor string to the coarse voltage output; thus, in this alternative, therefore, $V_{COARSE}$ may be one of 128 voltages corresponding to the drain voltages of the 128 coarse voltage access transistors. Finally, note that $V_{COARSE}$ is input to a switch circuit 26.

As mentioned in the preceding paragraph, switch circuit 26 receives $V_{COARSE}$ as one of its inputs. Additionally, as shown in FIG. 2, switch circuit 26 also receives $V_{MAIN}$ as another input. Given these inputs, switch circuit 26 includes sufficient circuitry to couple at one time one of its inputs to a first of its two outputs, while concurrently coupling the other of the inputs to a second of its two outputs. This functionality is detailed later, from which one skilled in the art may construct various circuits to achieve the desired operation. By way of introduction here, note that the outputs of circuit 26 are connected to corresponding inputs of op amps $OA_A$ and $OA_B$, and each of those op amp inputs is connected to a respective output sampling capacitor $C_A$ and $C_B$. Thus, at a same time, circuit 26 may connect either input $V_{MAIN}$ or $V_{COARSE}$ to a first one of op amps $OA_A$ and $OA_B$ while concurrently connecting the other of those inputs to a second one of op amps $OA_A$ and $OA_B$. As further appreciated below, these connections ultimately give rise to output signals from each of op amps $OA_A$ and $OA_B$ at respective outputs $OUT_A$ and $OUT_B$.

The operation of DAC 20 is now described further, starting with a general overview and then exploring various details for further understanding and elaboration. In a broadest sense, DAC 20 receives digital data words and converts them to corresponding analog voltages as is the case for other DAC technology. More specifically, however, DAC 20 provides three additional aspects. In one aspect, without two different row decoders, a two-channel output is provided, with the first channel being $OUT_A$ and the second channel being $OUT_B$. Additionally, this dual channel operation is overlapping such that while one channel output is valid the other is being developed. As another aspect, DAC 20 determines an output voltage not solely in response to a digital input word, but instead in response to a comparison between that word and a prior word received by the DAC. In other words, rather than merely responding to each digital word as it is received as is the case in the prior art, DAC 20 uses a comparison between successive digital words and the output is charged in response to that comparison. In this regard, note that the term successive is used to mean one digital word following another at some later point, but it is not limited to digital words which are immediately following one another. As yet another aspect, the settling time of the DAC output is reduced by increasing, or "boosting", the output charge voltage for one or more time periods and thereafter permitting the output voltage to settle toward the final and desired output level. Each of the above aspects, alone and in combination, increases the overall speed of DAC 20 as compared to a typical single access prior art DAC.

Figure 3A:
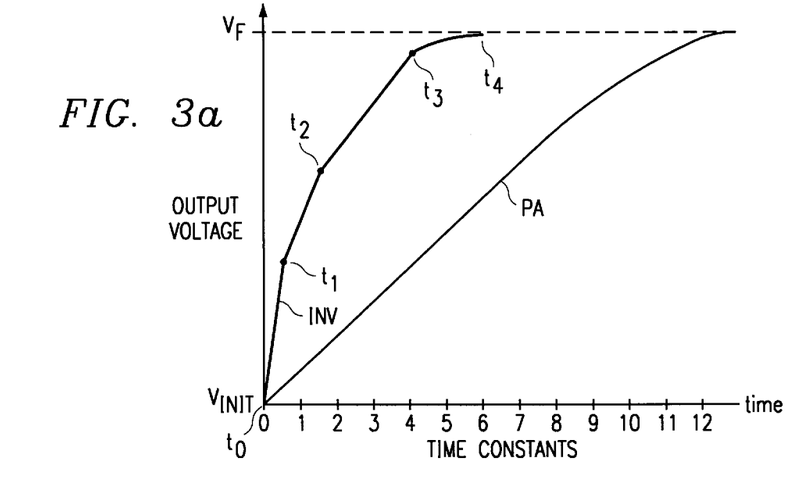
FIG. 3a illustrates plots of the output charging signals over time for the DACs of FIGS. 1 and 2.

As a further illustration of the operation of DAC 20, attention is now directed to the nature of the output charge signals provided by DAC 20. Specifically, FIG. 3a illustrates a plot of output charge voltage versus time to contrast the operation of a typical prior art DAC output and that of the preferred embodiment as achieved using $V_{MAIN}$ and $V_{COARSE}$. More particularly, FIG. 3a illustrates two plots, one designated as PA for a prior art DAC, and another designated INV corresponding to the present inventive embodiments. The plots indicate output voltage in the vertical dimension and time, shown in units of RC time constants, in the horizontal dimension. While the plots are not necessarily drawn to an exact scale, they generally depict, for both a prior art and inventive DAC, the rise of an output analog charge signal in response to an input digital word. For purposes of reference, this rise is shown from a first level $V_{INIT}$ to a final output, $V_F$.

Looking more particularly to the signals in FIG. 3a, and turning first to the prior art plot PA, it suggests by way of an arbitrary example that a typical prior art DAC, such as a 16-bit DAC built in the form of DAC 10 in FIG. 1, requires 12 time constants to rise to $V_F$. $V_F$ is a level that is acceptably close to the ultimate output analog voltage asymptote given the RC load on the charge voltage. However, the preferred embodiment reaches $V_F$ in a lesser amount of time (i.e., at an increased speed). This preferred operation is achieved in part by charging a corresponding one of the charge capacitors connected to either of op amps $OA_A$ and $OA_B$ first with a "boosted" voltage, meaning a voltage that has an asymptote beyond $V_F$. For example, between $t_0$ and $t_1$, note the increased slope of the INV plot versus that of the PA plot. In this manner, the preferred embodiment output capacitor charges faster than the prior art case where it is charged only toward the value of $V_F$. Further in this regard, in the preferred embodiment, the boosted voltage is used to select from the resistor meander a "coarse" (i.e., estimated) voltage corresponding to the boosted voltage and, hence, this estimate is provided by $V_{COARSE}$ to switch circuit 26. In response, switch circuit 26 may then charge one of the charge capacitors $C_A$ or $C_B$ using $V_{COARSE}$.

Also in the preferred embodiment, the same methodology just described as occurring between $t_0$ and $t_1$ is repeated for one or more additional time periods, where in each consecutive time period the level of boost is reduced so that the output charging voltage is reduced in magnitude relative to the immediately preceding period, but further where that asymptote is still beyond that of $V_F$. For example, between $t_1$ and $t_2$ the charge voltage still has a larger asymptote, and hence a steeper slope, than plot PA between $t_1$ and $t_2$, but the charge voltage has a lesser slope (and asymptotic maximum) then the charge between $t_0$ and $t_1$. Once more, this boosted voltage is used to select a coarse voltage to charge the output sampling capacitor between $t_1$ and $t_2$. This process may again repeat, such as shown between $t_2$ and $t_3$.

Ultimately in the preferred embodiment, the charge voltage connected to an output sampling capacitor is refined by setting that voltage equal to $V_F$. Briefly, note that this operation is achieved by switch circuit 26 changing its input so that $V_{MAIN}$ is now connected to the sampling capacitor that immediately before was connected to $V_{COARSE}$. In FIG. 3a, this occurs at $t_3$. Accordingly, after some additional charge period, such as shown between $t_3$ and $t_4$, the final output voltage $V_F$ is then reached (or nearly reached as it is approached in the sense of an asymptote) and hence a valid output signal is available for sampling from the output of the op amp corresponding to the charged sampling capacitor. Each of these operations should be appreciated further in view of the remaining aspects of the preferred embodiments.

Figure 3B:
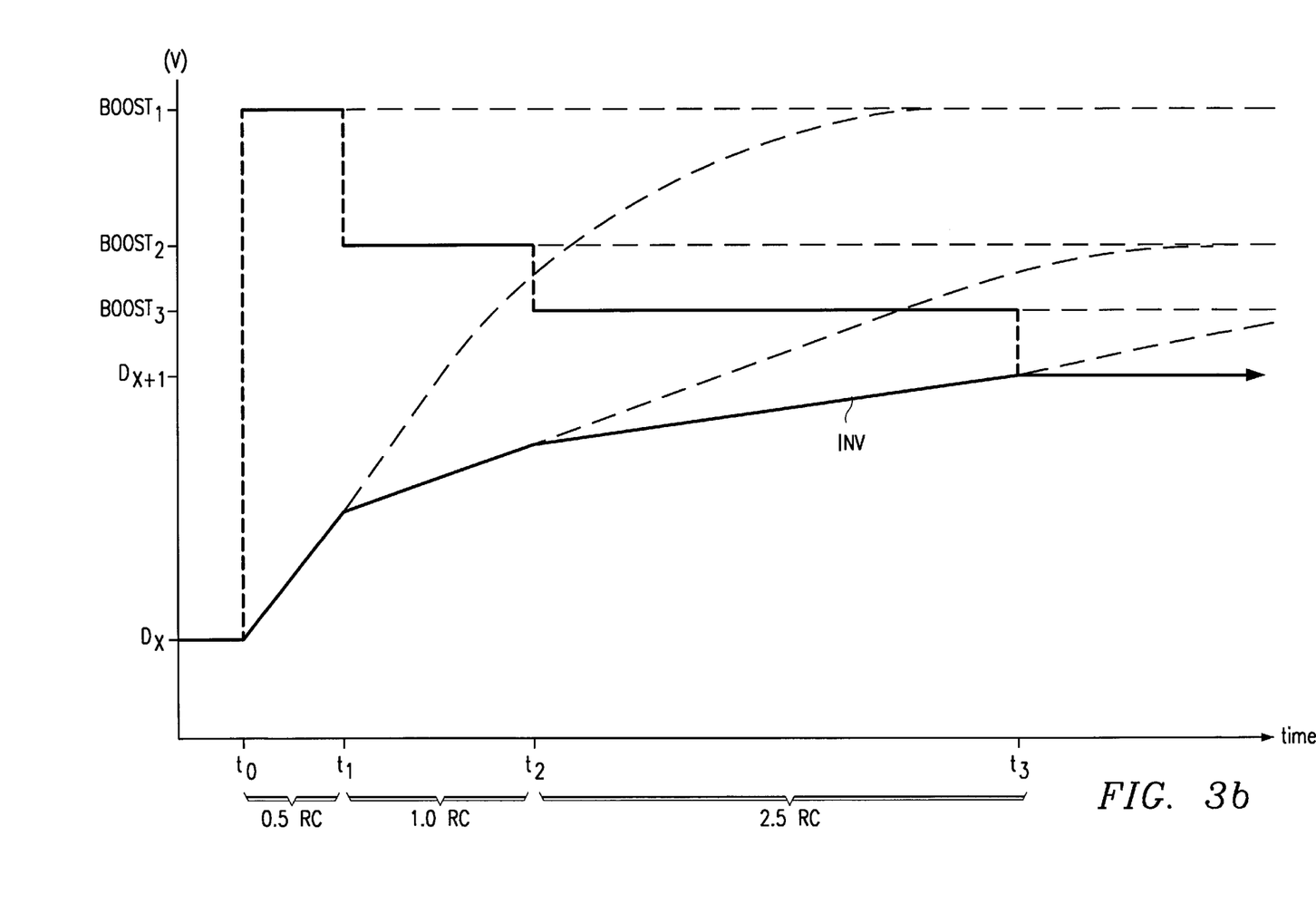
FIG. 3b illustrates plots of referred stepping function of the changing boost levels for the DAC of FIG. 2.

FIG. 3b again illustrates a plot of INV from FIG. 3a but here in greater detail to further introduce two of the preferred embodiment aspects described above, namely, using a comparison of successive digital words to drive the output of DAC 20 and using a boosted value to drive that output. Specifically, FIG. 3b illustrates in the vertical dimension various voltage levels, where a first digital word $D_X$ is represented as is a successive digital word $D_{X+1}$. The horizontal dimension in FIG. 3b illustrates time, and is further divided into time constants in increments of "RC," where RC is the time constant imposed on a tap in DAC 20. Still further, the events from to through $t_3$ from FIG. 3a are shown in FIG. 3b, and are further explored immediately below.

Assume at a time prior to $t_0$ that DAC 20 is outputting a value equal to $D_X$ and, as of to, DAC 20 begins to operate to generate an output corresponding to a successive digital word $D_{X+1}$. In this regard, DAC 20 determines a difference, designated in this document as Δ, between the digital words at issue (i.e., here, $D_X$ and $D_{X+1}$). This difference is then used to generate an output that ultimately will settle to $D_{X+1}$, but which initially will charge toward an asymptote beyond $D_{X+1}$. Particularly, in the preferred embodiment the difference Δ is "boosted," that is, it is increased by a boost factor B, and the increased result is used for multiple periods prior to providing an output merely equal to $D_{X+1}$. Further, in the preferred embodiment the length of each period differs as does its corresponding boost factor, as shown by the varying signals in FIG. 3b, as detailed immediately below.

In the preferred embodiment, the first boosting period is 0.5RC long and uses a boost factor equal to equal to 2 to determine an asymptotic charging level for the first period, illustrated in FIG. 3b as $BOOST_1$. This is shown in FIG. 3b between $t_0$ and $t_1$. In addition, in order for the asymptote to be properly located relative to $D_X$, then the product of 2Δ is added to the value of $D_X$. This operation is perhaps better understood by way of a numeric example; accordingly, assume that $D_X$ equals decimal 5 and $D_{X+1}$ equals decimal 13. Accordingly, during this first period, Δ equals decimal 8 and BOOST, equals 21(i.e., $[(2*8)+D_X]=(2*8)+5=21$). Thus, DAC 20 has determined an asymptotic value that is 2Δ greater than the current value of $D_X$, which in the present case is 21. In response, DAC 20 uses the result to select a voltage for $V_{COARSE}$ and that $V_{COARSE}$ is output and used to charge the output toward $BOOST_1$ as shown between $t_0$ and $t_1$. As discussed below, at $t_1$ a new boosting period is commenced and, therefore, the output is charged toward a new asymptote; however, to complete the illustration with respect to the first boosting period, then after $t_1$ a line is shown in phantom illustrating that the value of $V_{COARSE}$ used between $t_0$ and $t_1$, if extended beyond $t_1$, would approach the asymptote defined by $BOOST_1$.

The second boosting period is shown in FIG. 3b between $t_1$ and $t_2$, during which a second boost factor equal to 1.5 is multiplied times Δ, and then added to the value of $D_X$, thereby providing an asymptote of $BOOST_2$ during this period. In the preferred embodiment, the second boosting period is 1.0RC long. Accordingly, during this second boosting period, the output is charged toward the asymptote of $BOOST_2$. However, because the second boosting period is 1.0RC long, then during this time the output does not reach $BOOST_2$; nevertheless, to demonstrate the asymptotic behavior of the charging level during the second boosting period, note that the charge level if extended after $t_2$ is again shown in phantom, and here demonstrates that the charge level would eventually approach $BOOST_2$.

Lastly, a third boosting period is shown in FIG. 3b between $t_2$ and $t_3$, during which a third boost factor equal to 1.25 is multiplied times Δ, and then added to the value of $D_X$, thereby providing an asymptote of $BOOST_3$ during this period. In the preferred embodiment, the third boosting period is 2.5RC long. During this third boosting period, the output is charged toward the asymptote of $BOOST_3$. Since the third boosting period is 2.5RC long, then during this time the output does not reach $BOOST_3$, but to demonstrate the asymptotic behavior of the charging level during the third boosting period the charge level is extended in phantom to demonstrate that the charge level eventually would approach $BOOST_3$.

Given the preceding, one skilled in the art will appreciate the changing slope and asymptotic behavior of plot INV between $t_0$ and $t_3$. In addition, FIG. 3b illustrates in the same manner as FIG. 3a that after $t_3$ $V_{MAIN}$ is connected to the sampling capacitor that immediately before was connected to $V_{COARSE}$. Thus, after some additional charge period, the final output voltage $V_F$ will reach that of the successive digital word $D_{X+1}$ in the sense of an asymptote. Further in this regard, it is noted that this final period also will accommodate for any variance in the value of RC. More particularly, recall that the duration of each of the boosting periods is based on RC, which is the time constant imposed on a tap in DAC 20. However, to the extent that RC is estimated with some level of variance, then the charged output voltage at $t_3$ may still be some distance from the value of $D_{X+1}$. The final period after $t_3$, however, will correct this distance by causing the output to settle toward the value of $D_{X+1}$.

As an additional observation with respect to FIG. 3b, note that it illustrates the example where the successive digital word is larger than the word to which it is being compared, and it is stated that the boosting asymptote is "beyond" the ultimate final output voltage. This terminology is now further explored by noting that the preferred embodiment also implements boosted periods with respect to a successively decreasing word, where the boosting is in a downward fashion as opposed to upward as shown by example above. For example, assume that $D_X$ equals decimal 13 and $D_{X+1}$ equals decimal 5. Here, once again Δ equals 8, but the "boosting" is downward in that the first boosting period (e.g., 0.5RC) is directed to an asymptote far less than $D_{X+1}$. In this sense, therefore, the asymptote is beyond $D_{X+1}$ when considered from a direction relative to the previous digital word, $D_X$. Further, the second boosting period (e.g., 0.5RC) is directed to an asymptote also beyond (and less than) $D_{X+1}$ but not as low as the asymptote of the first boosting period, while the third boosting period (e.g., 2.0RC) is directed to an asymptote less than $D_{X+1}$ but not as low as either the asymptote of the first boosting period or the asymptote of the second boosting period. Thereafter, the output is allowed to settle to a value equal to $D_{X+1}$. Thus, in either the case of successively increasing or successively decreasing words, it may be stated that they have in common a sequence of boosting periods, where in the boosting period the direction (i.e., either up or down) of the level of boost matches the relative value from the first word to the successive word. In other words, if the successive word is greater than the first word, then the boosting asymptotes are upward and greater than the successive word. Conversely, if the successive word is less than the first word, then the boosting asymptotes are downward and less than the successive word. In either case, therefore, for each boosting period the difference between the asymptote and the first word is greater than the difference between the successive word and the first word.

To further appreciate the operation described above, FIG. 4 illustrates a block diagram showing greater detail within data storage, comparison, and boost circuit 22 of FIG. 2. In general, circuit 22 includes two storage circuits 28 and 30 for receiving pairs of incoming successive data words, where in the preferred embodiment the pairings are such that alternating words are directed to alternating ones of storage circuits 28 and 30. For a current example and to be used for the remainder of this document, assume after various digital words have been processed by DAC 20, then a sequence of 4-bit words $D_0$, $D_1$, $D_2$, and $D_3$ are communicated to DAC 20. $D_0$, as the first word in the sequence, is directed to storage circuit 28 (shown in element 28a of storage circuit 28), while the next successive but alternating word, $D_1$, is directed to the alternating storage circuit 30 (shown in element 30a of storage circuit 30). This pattern continues, so the third word in the succession, $D_2$, once again is directed to an alternating one of the storage circuits and, hence, it is stored in element 28b of storage circuit 28. Finally, the fourth word in the succession, $D_3$, is directed to an alternating one of the storage circuits and, hence, it is stored in element 30b of storage circuit 30.

Figure 4:
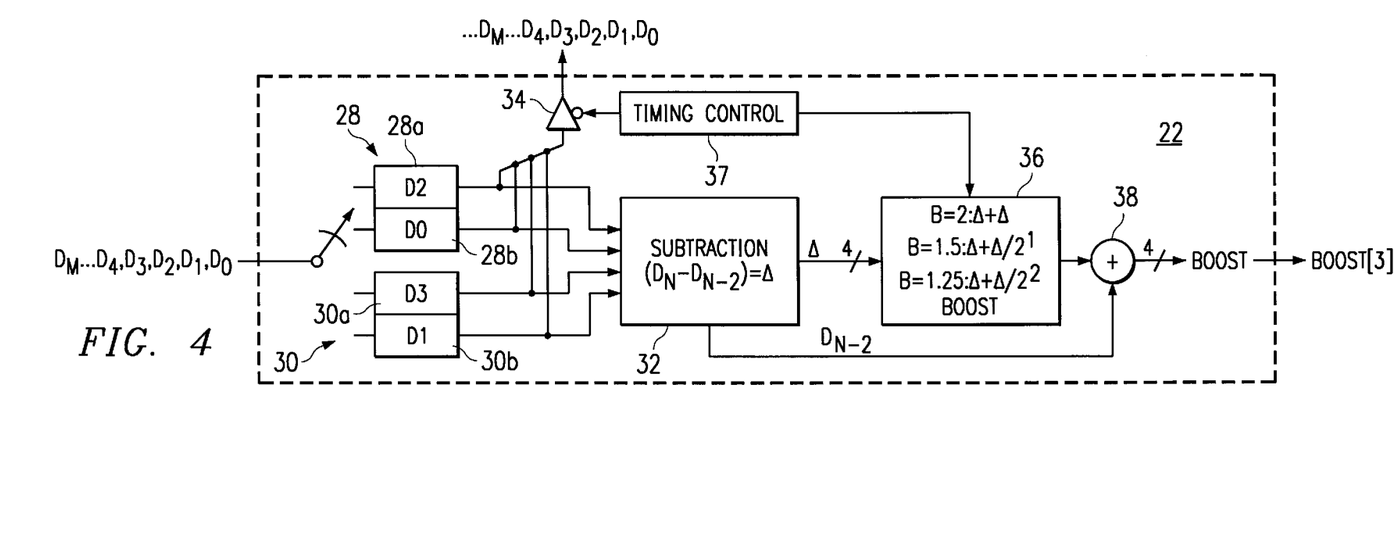
FIG. 4 illustrates a schematic and block diagram of circuit 22 of FIG. 2.

The outputs of storage circuits 28 and 30 are connected to a subtraction circuit 32, and also to the input of a passgate 34. Looking first to subtraction circuit 32, it provides the comparison function introduced earlier, that is, it provides a signal representative of alternately received successive digital input words. In the preferred embodiment, this comparison is the value introduced earlier as $\Delta$, which equals the difference between the paired digital values stored in either of storage circuits 28 or 30. For example, when subtraction circuit 32 operates with respect to storage circuit 28, then $\Delta$ is the difference between $D_2$ and $D_0$. Similarly, when subtraction circuit 32 operates with respect to storage circuit 30, then $\Delta$ is the difference between $D_3$ and $D_1$. In other words, given the configuration of circuit 22 thus far, one skilled in the art will appreciate that $\Delta$ relates to the difference between every other digital word received in the sequence of words. Once a value of $\Delta$ is determined, it is used to influence the ultimate output of DAC 20 by coupling it to boost circuit 36.

Boost circuit 36 provides the changing slopes corresponding to the changing asymptotic charge levels illustrated between consecutively numbered time periods in FIGS. 3a and 3b. In the preferred embodiment boost circuit 36 provides the three different periods of boosting introduced above, by providing an appropriate boost factor B which is multiplied times $\Delta$, and where B decreases for each consecutive period. Recall in the preferred embodiment that the three levels of B correspond to a first level equal to 2, a second level equal to 1.5, and a third level equal to 1.25. In addition, a timing control circuit 37 controls the duration of each of these periods, that is, the duration that each boost level is multiplied times $\Delta$, where recall here that the first time period equals 0.5RC, the second time period equals 1.0RC, and the third time period equals 2.5RC. Accordingly, the preceding descriptions should demonstrate to one skilled in the art that after a period equal to 4.0RC, the output is charged relatively close to $V_F$.

The product from boost circuit 36 is provided per period, and for each such period it is added via an adder 38 to the most recent digital word, which is thus shown in FIG. 4 as $D_{N-2}$. Note that this aspect involving the addition function applies to either the case where the successive word ($D_N$) is greater than the preceding word ($D_{N-2}$), or where the successive word ($D_N$) is less than the preceding word ($D_{N-2}$), and the function thereby produces a boosting asymptote that is properly positioned relative to $D_{N-2}$. The case where the successive word is greater than the preceding word should be relatively straightforward given the example set forth above. However, where the successive word is less than the preceding word, a few additional observations may be helpful. In this regard, when the successive word is less than the preceding word note that $\Delta$ will be negative number. For example, assume that $D_{N-2}$ equals 13 and $D_N$ equals 5. Once more, adder 38 again adds the boosting product to $D_{N-2}$, but the boosting product will be a negative number thereby causing a subtraction of the absolute value of the boosting product from $D_{N-2}$. Accordingly, the resulting asymptote will be properly positioned by the boost factor (e.g., 2, 1.5, 1.25) relative to $D_{N-2}$. More particularly, in the first period, the asymptote value equals an asymptote that is $|2\Delta|$ less than $D_{N-2}$, in the second period the asymptote value equals an asymptote that is $|1.5\Delta|$ less than $D_{N-2}$, and in the third period the asymptote value equals an asymptote that is $|1.25\Delta|$ less than $D_{N-2}$.

The output of adder 38 provides the BOOST signal. Further, recall from the description of FIG. 2 that in the preferred embodiment only half of the bit line address (i.e., the MSBs) are actually used from the BOOST signal to select $V_{COARSE}$; as a result and as further discussed below, the output of boost circuit 22 is shown to only provide bit 3 of BOOST (i.e., shown in FIG. 4 as BOOST[3]).

While the preferred embodiment implements various specifics as described above, note that various alterations are also within the present inventive scope. For example, the preceding describes three different periods of boosting the output charge with each period having a different duration. However, alternative embodiments may be created by modifying any one or more of the number of periods, the duration for each period, and the level of boost during a period. Indeed, with respect to the notion of the level of boosting, note that the preferred embodiment chooses $V_{COARSE}$ since it is readily obtained from voltage levels selected from the DAC resistor string. However, other boosting techniques may be developed within the present inventive scope given the inventive aspect of using successive DAC input data to provide the value of $\Delta$. In this regard, a spectrum of boosting techniques may be contemplated, where at one end of the spectrum is an implementation that charges over time a capacitance equal to the output sampling capacitor via a resistor to effectively model the RC load of the DAC while at the other end of the spectrum is an implementation that moves charge to a capacitance equal to the output sampling capacitor with an acceptable source of power. Still further, the illustration and description depicted above suggests boosting levels that create a signal that monotonically approaches the asymptote defined by the final data value (i.e., $V_F$ in FIG. 3a). However, in an alternative embodiment, it may be preferred to implement a level of boosting so that during the charging process the output extends beyond the ultimate output voltage and then during one or more final periods it converges to the ultimate output voltage.

The specific boost factors implemented by boost circuit 36 also may be adjusted by one skilled in the art; however, the values presented above are preferred in the sense that powers of 2 are implicated. More particularly, since each of the preferred boost factors may be related to a power of 2, it allows each factor to be implemented through addition and, in instances where a non-integer boost is achieved, through additional binary shifting. For example, for a value of B=2 (i.e., an integer), $\Delta$ is preferably added to itself, thereby producing a result equal to $2\Delta$. As another example, for a value of B=1.5 (i.e., a non-integer), first a value of $0.5\Delta$ is obtained by shifting the value of $\Delta$ once to the right (i.e., in effect, dividing by a factor of 2), and then the total of $1.5\Delta$ is achieved by adding the shifted result to the value of $\Delta$. As yet another example, for a value of B=1.25, first a value of $0.25\Delta$ is obtained by shifting the value of $\Delta$ twice to the right (i.e., in effect, dividing by a factor of $2^2$), and then the total of $1.25\Delta$ is achieved by adding the shifted result to the value of $\Delta$. In any event, once the boosted value is determined, it is used to select a coarse voltage as detailed below, at which point it also will be apparent why only a portion of the boosted number (i.e., bit [3] in the example of FIG. 2) is used in this manner.

The operation of coarse voltage selector 24 is best appreciated in more detail by returning to FIG. 2. In this regard, note in the preferred embodiment that the available levels of coarse voltages are dictated by the placement of coarse voltage access transistors CVAT0 and CVAT1. In the embodiment illustrated, those transistors are located between each pair of bit lines. Thus, for a DAC with a number X bit lines, the preferred embodiment locates a number X/2 of coarse voltage access transistors, with each positioned between a corresponding pair of bit lines. As a result, to select among these X/2 transistors, only one-half the selection capability required for the bit lines is required to access a coarse voltage. For example, where there are four bit lines such as in DAC 20, there are two coarse voltage access transistors and, hence, only one bit (i.e., $2^1=2$) is needed to choose among these transistors. In a larger DAC, such as 256 bit line DAC by way of example, the preferred methodology therefore locates 128 coarse voltage access transistors and, hence seven bits (i.e., $2^7=128$) are required to select among these transistors. Another manner of stating the preceding is that there are only half as many coarse voltage access transistors as there are bit lines, and hence the bit line address (i.e., the MSBs of the input word) may be halved to select among the coarse voltage access transistors. Half of a binary number is defined by all bits other than the least significant bit of that number, which technically may be achieved by shifting the binary number once to the right, or simply disregarding its least significant bit Thus, for DAC 20 which has only two MSBs to select among its four bit lines, shifting those once to the right leaves only one MSB to select among the coarse voltage access transistors. For this reason, therefore, only bit [3] of the BOOST signal is connected from circuit 22 to selector 24. The value of this single bit, therefore causes either coarse voltage access transistor CVAT0 or CVAT1 to be selected. Of course, where a greater number of MSBs are implemented, then one less than this larger number of bits are presented as the boosted signal to selector 24.

The preceding paragraph as applied to DAC 20 is better understood by way of a few examples. Suppose that the BOOST signal equals 0111. The two MSBs of this value, therefore, equal 01. Accordingly, for the given BOOST signal, only the bit position [3] value of 0 reaches coarse voltage selector 24 and, in response, it enables transistor CVAT0. Consequently, the voltage at tap T3' is output as $V_{COARSE}$ to switch circuit 26. In response, this coarse voltage is used for the appropriate time period to charge the selected charge capacitor connected to either op amp $OA_A$ or op amp $OA_B$. As another example, assume that the BOOST signal equals 1001. The two MSBs of this value, therefore, equal 10. Accordingly, the bit position [3] value of 1 reaches coarse voltage selector 24 and, in response, it enables transistor CVAT1, thereby causing the voltage at tap T11' to be output as $V_{COARSE}$ to switch circuit 26, and thereby providing this voltage to charge the appropriate one of charge capacitors $C_A$ or $C_B$. Lastly, note that the above example of only two coarse voltages arises from the simplification that arises from the present example of a 16-bit DAC. In a more likely scenario, the DAC is considerably larger and, hence, so will be the number of available coarse voltages from which a selection may be made.

Figure 5:
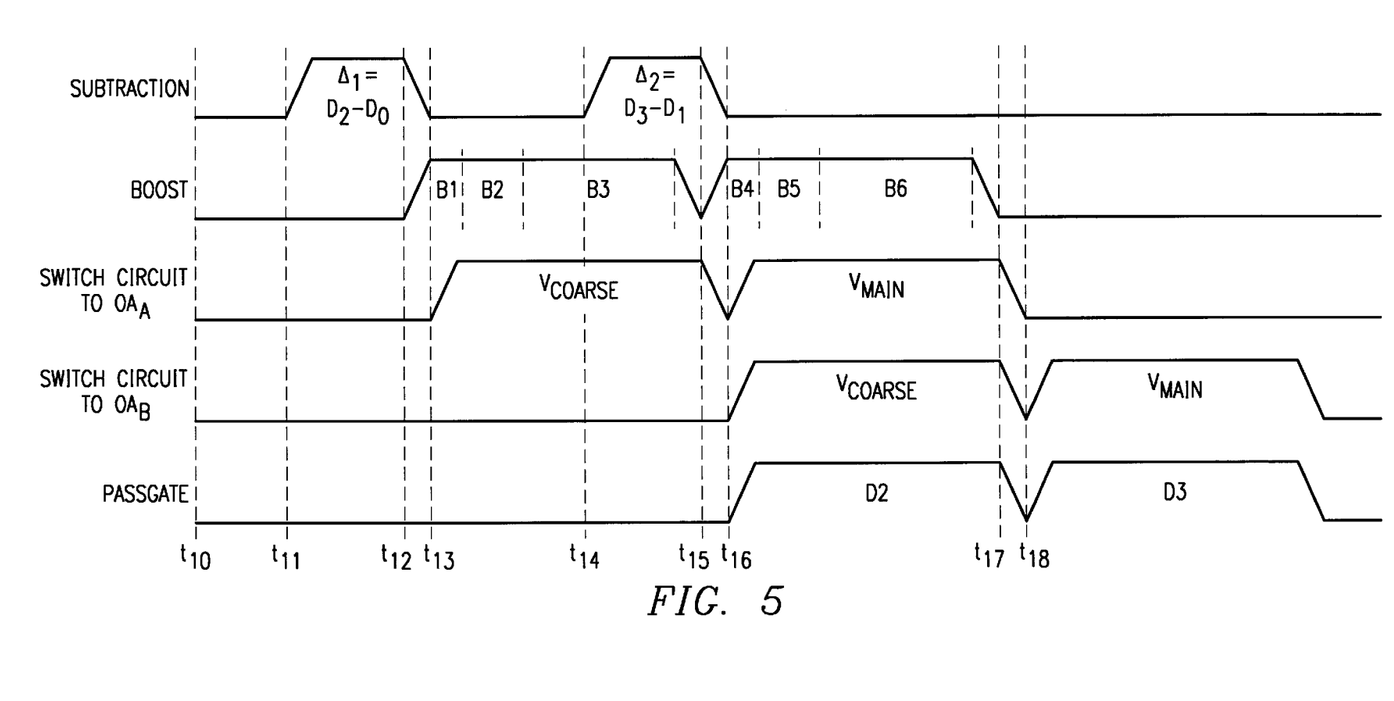
FIG. 5 illustrates a timing diagram of the operation of DAC 20 of FIG. 2.

To further elaborate on the previous discussions, FIG. 5 illustrates a timing diagram of the operation of DAC 20, and it should be noted that exact timing and delays are not shown but instead the illustration presents a framework to demonstrate the general sequential and overlapping operations of various circuits. The diagram starts at a time designated $t_{10}$, which is arbitrarily numbered to distinguish it from other time identifiers used earlier. At $t_{10}$, assume for purposes of simplifying the present discussion that DAC 20 already has processed earlier digital input words, and has now stored the sequence of $D_0$ and $D_2$, and $D_1$ and $D_3$ in storage circuits 28 and 30, respectively. Assume further that output signals for $D_0$ and $D_1$ also have already been provided. Various other events then follow as described below, which for purposes of convenience are first discussed with respect to digital input word $D_2$, followed by a discussion with respect to with respect to digital input word $D_3$. Lastly, FIG. 5 only illustrates the operations of two successive input words to simplify the illustration, while one skilled in the art will understand that DAC 20 may continue to operate in the same manner with respect to additionally received digital input words.

Looking first to the relationship of FIG. 5 with respect to $D_2$, at $t_{11}$, subtraction circuit 32 determines the value of $\Delta_1$ equal to $D_2-D_0$. Next, beginning at $t_{12}$, boost circuit 36 determines and outputs, with respect to $\Delta_1$, the three successive boost products corresponding to the boost factors of 2, 1.5, and 1.25, with each then added to the value of $D_0$. For purposes of illustration, these results correspond to the values shown in FIG. 5 as B1, B2, and B3, respectively. Recall that in response to the two MSBs of the values, or at least in response to all but the least significant bit of those MSBs, a coarse voltage is selected by selector 24 and presented to switch circuit 26. Thereafter, following some slight delay shown in FIG. 5 as of $t_{13}$, switch circuit 26 connects $V_{COARSE}$ to charge sampling capacitor $C_A$. As a result, one skilled in the art will appreciate that between $t_{13}$ and $t_{15}$ the boosted charging effect shown between $t_0$ and $t_3$ of FIGS. 3a-3b occurs. In other words, starting at $t_{13}$, a coarse analog voltage charges capacitor $C_A$ in response to a boosted value relating to the difference between $D_2$ and $D_0$. Next, at $t_{16}$, timing control circuit 37 enables passgate 34 so that $D_2$ is connected to inputs I0'-I3' of DAC 20. As a result, the value of $D_2$ at this point is applied to the array in the same manner as described with respect to FIG. 1, but here the driven output is $V_{MAIN}$. Moreover, also at $t_{16}$, switch circuit 26 connects $V_{MAIN}$ to charge sampling capacitor $C_A$. Consequently, following $t_{16}$, $V_{MAIN}$ completes the charge on charge capacitor $C_A$ from its existing value of $V_{COARSE}$ to a final value having $V_{MAIN}$ as its asymptote. In other words, $V_{MAIN}$ refines the value that resulted from the charge presented by $V_{COARSE}$ toward an ultimate settled value. Thus, after some delay following $t_{16}$, where this delay is complete as of time $t_4$ in FIG. 3a, the output of op amp $OA_A$ provides a valid analog voltage corresponding to $D_2$. Accordingly, at this time, that analog voltage may be sampled at the op amp output and used for the appropriate purpose(s). Moreover, note that $t_4$ is considerably earlier in time that the 12 time constants required of the prior art to reach the comparable $V_F$ level. From this, one skilled in the art will appreciate the greatly enhanced speed of operation of DAC 20 in comparison to the prior art.

Looking now to the relationship of FIG. 5 with respect to $D_3$, at $t_{14}$, subtraction circuit 32 determines the value of $\Delta_2$ equal to $D_3-D_1$. Thus, this operation overlaps the above-described operations which are then occurring relative to $\Delta_1$. Next, beginning at $t_{15}$, boost circuit 36 determines and outputs, with respect to $\Delta_2$, the three successive boost products corresponding to the boost factors of 2, 1.5, and 1.25, and each of these is added to $D_1$ to form the results of shown in FIG. 5 as B4, B5, and B6, respectively. Once more, therefore, the results relating to these values (or a portion thereof) cause coarse voltage selector 24 to select an appropriate coarse voltage and present it as $V_{COARSE}$ to switch circuit 26. Next, following some slight delay shown in FIG. 5 as of $t_{16}$, switch circuit 26 connects $V_{COARSE}$ to charge sampling capacitor $C_B$. Thus, between $t_{16}$ and $t_{17}$ a boosted charging effect once more occurs, where here it relates to the value of $\Delta_2$, and is used to charge sampling capacitor $C_B$.

Next, at $t_{18}$, timing control circuit 37 enables passgate 34 so that $D_3$ is connected to inputs I0'–I3' of DAC 20 and, therefore, the value of $D_3$ is applied to the array to drive the value of $V_{MAIN}$. At the same time, switch circuit 26 connects $V_{MAIN}$ to charge sampling capacitor $C_B$. This action now refines the coarse voltage on capacitor $C_B$ to an ultimate settled value relating to $\Delta_2$ such that after some delay following $t_{18}$, the output of op amp $OA_B$ provides a valid analog voltage corresponding to $D_3$ and that analog voltage may be sampled at the output and used for the appropriate purpose(s). Lastly, and in the same manner described with respect to op amp $OA_A$ above, the output of op amp $OA_B$ is also achieved considerably faster than that of a prior art DAC.

Having detailed the preferred two step charging methodology using first $V_{COARSE}$ and then following with $V_{MAIN}$, two additional aspects are noteworthy with respect to capacitance. First, recall it was noted with respect to FIG. 1 that a tap voltage, when selected, incurs the capacitance presented by the entire array through the output, including the switching transistor, the bit line, the column access transistor, and the output sampling capacitor. In contrast, during the time periods when the preferred embodiment uses $V_{COARSE}$ to charge the output sampling capacitor, note that a lesser amount of capacitance is imposed on the node (e.g., tap T3' or T11') that is providing the driving voltage. Accordingly, in addition to the increased speed due to boosting, the preferred embodiment further increases the charge speed by reducing effective capacitance during the periods when $V_{COARSE}$ is charging the output. Second, a further modification to DAC 20 would be to add a non-complex voltage buffer between the sources of coarse voltage access transistors CVAT0 and CVAT1 and $V_{COARSE}$. Such a buffer would further reduce the effect of any larger output capacitance such as the capacitance of sampling capacitor $C_A$ and $C_B$. While this buffer may add a slight offset voltage to $V_{COARSE}$, the effect of such a voltage on the ultimate output would be nullified during the final charging phase when the output is instead charged by $V_{MAIN}$.

From the above, it may be appreciated that the above embodiments provide numerous advantages over the prior art, many of which have been set forth above and additional ones of which will be ascertained by one skilled in the art. As examples, the preferred DAC provides a dual output without requiring a second row decoder, and the output charge times are considerably faster than other prior art DAC configurations. As another example, the dual output nature doubles the device bandwidth while the additional circuitry to achieve this capacity does not double the total spatial requirements of the device. In addition, while the present embodiments have been described in detail, various substitutions, modifications or alterations could be made to the descriptions set forth above without departing from the inventive scope. Indeed, some of these type of variations have been set forth above, and still others may be ascertained. For example, while the illustration of FIG. 2 demonstrates a location of coarse access voltage transistors between bit lines, an alternative location could be implemented, as could a larger number of such transistors to provide a greater number of coarse voltages for selection. As another example, while DAC 20 has been shown to have a single input, dual inputs also could be used, and with those inputs each digital word could be compared to the word that immediately preceded it with respect to its same correspond input. As still another example, the preceding illustrations have shown a two channel DAC due to its enhanced output capability; nevertheless, many of the present inventive teachings may apply to a single channel DAC, or other multiple channel DAC, to increase its speed. In the case of a single channel DAC, digital input words are stored by the DAC and the difference between successive words which immediately follow one another, rather than alternating words, are used to generate a differential voltage from which a corresponding output analog voltage may be provided. In addition, the methodology of tailoring the differential voltage to first begin with a boosted coarse voltage component and then refining that voltage component with a main voltage component also may be implemented in a single channel DAC. As yet another example, while a single ended DAC has been illustrated, the present inventive teachings also may be applied to a fully-differential configuration, such as of the type shown in U.S. patent application Ser. No. 09/309,643, entitled "Auto-Calibrating Resistor String In A Data Converter," filed May 11, 1999, having the same inventors as the present application, and hereby incorporated herein by reference. As a final example, while the illustrations have been directed to a DACs with four inputs, the present teachings apply equally to DAC having greater or lesser input/output capacities. Thus, all of the preceding as well as other ascertainable examples should further illustrate the inventive scope, where that scope is defined by the following claims.

What is claimed is:

1. A digital to analog converter, comprising:
   an input for receiving a plurality of successive digital words;
   circuitry for storing the plurality of successive digital words;
   a string of series connected resistive elements, wherein the string comprises a plurality of voltage taps;
   an output for providing an analog output voltage corresponding to a selected one of the plurality of successive digital words;
   comparison circuitry for comparing the selected one and an earlier received one of the plurality of successive digital words; and
   circuitry for generating the analog output voltage in response to the comparison circuitry.

2. The converter of claim 1 wherein the comparison comprises circuitry for forming a difference comparison by subtracting the earlier received one of the plurality of successive digital words from the selected one of the plurality of successive digital words.

3. The converter of claim 2 wherein the circuitry for generating the analog output voltage comprises circuitry for first coupling a first voltage to charge an output capacitance in response to the difference comparison.

4. The converter of claim 3 wherein the circuitry for coupling the first output voltage to charge the output capacitance in response to the difference comparison charges the output capacitance in response to a boosted value equal to a multiple of the difference comparison.

5. The converter of claim 3:
   wherein the first voltage is provided by a selected one of the plurality of voltage taps; and
   wherein the selected one of the plurality of voltage taps is selected in response to the difference comparison.

6. The converter of claim 3:
   wherein the circuitry for generating the analog output voltage further comprises circuitry for second coupling a second voltage to further charge the output capacitance; and
   wherein the analog output voltage is responsive to the first voltage and the second voltage coupled to the output capacitance.

7. The converter of claim 6 wherein the circuitry for coupling the second output voltage to charge the output capacitance charges the output capacitance in response to a boosted value equal to a multiple of the difference comparison.

8. The converter of claim 6:
wherein the second voltage is provided by a selected one of the plurality of voltage taps; and
wherein the selected one of the plurality of voltage taps is selected in response to the difference comparison.

9. The converter of claim 6:
wherein the earlier received one of the plurality of successive digital words has a first corresponding analog voltage;
wherein the selected one the plurality of successive digital words has a second corresponding analog voltage;
wherein the first voltage has a first asymptote;
wherein a difference between the first asymptote and the first corresponding analog voltage is greater than a difference between the second corresponding analog voltage and the first corresponding analog voltage;
wherein the second voltage has a second asymptote; and
wherein a difference between the second asymptote and the first corresponding analog voltage is greater than a difference between the second corresponding analog voltage and the first corresponding analog voltage.

10. The converter of claim 9 wherein the difference between the second asymptote and the first corresponding analog voltage is less than the difference between the first asymptote and the first corresponding analog voltage.

11. The converter of claim 10:
wherein the circuitry for generating the analog output voltage comprises circuitry for third coupling a third voltage to charge the output capacitance in response to the difference comparison; and
wherein the analog output voltage is responsive to the first voltage and the second voltage and the third voltage coupled to the output capacitance.

12. The converter of claim 11:
wherein the third voltage has a third asymptote; and
wherein a difference between the third asymptote and the first corresponding analog voltage is greater than a difference between the second corresponding analog voltage and the first corresponding analog voltage.

13. The converter of claim 12 wherein the difference between the third asymptote and the first corresponding analog voltage is less than the difference between the second asymptote and the first corresponding analog voltage.

14. The converter of claim 11:
wherein the third voltage is provided by a selected one of the plurality of voltage taps; and
wherein the selected one of the plurality of voltage taps is selected in response to the difference comparison.

15. The converter of claim 11:
wherein the circuitry for generating the analog output voltage comprises circuitry for fourth coupling a fourth voltage to charge the output capacitance, wherein the fourth voltage corresponds to the selected one of the plurality of successive digital words.

16. The converter of claim 11 wherein the circuitry for coupling the third voltage to charge the output capacitance in response to the difference comparison charges the output capacitance in response to a boosted value equal to a multiple of the difference comparison.

17. The converter of claim 1:
wherein the output comprises a first output for providing a first analog output voltage;
and further comprising a second output for providing a second analog output voltage.

18. The converter of claim 17 wherein the selected one and the earlier received one of the plurality of successive digital words comprise alternately received digital words.

19. The converter of claim 1 wherein the comparison circuitry compares the selected one and the earlier received one of the plurality of successive digital words by forming a difference comparison by subtracting a digital representation of the earlier received one of the plurality of successive digital words from a digital representation of the selected one of the plurality of successive digital words.

20. The converter of claim 19 wherein the circuitry for generating the analog output voltage in response to the comparison circuitry comprises:
circuitry for selecting a voltage at one of the plurality of voltage taps in response to the difference comparison; and
circuitry for coupling the selected voltage to charge an output capacitance to form the analog output voltage.

21. The converter of claim 20 wherein the circuitry for selecting selects the voltage at one of the plurality of voltage taps in response to a product equal to a boost factor times the difference comparison.

22. The converter of claim 21 wherein the boost factor is selected from the group consisting of 2.0, 1.5, and 1.25.

23. The converter of claim 21 wherein the boost factor is selected from the group consisting of an integer or an integer plus a product comprising a power of 2.

24. The converter of claim 1 wherein the circuitry for generating the analog output voltage in response to the comparison circuitry comprises, for each of a plurality of time periods:
circuitry for selecting a corresponding voltage at one of the plurality of voltage taps in response to the difference comparison; and
circuitry for coupling each selected corresponding voltage to charge an output capacitance to form the analog output voltage.

25. The converter of claim 24 wherein the circuitry for selecting selects, for each of the plurality of time periods, the corresponding voltage at one of the plurality of voltage taps in response to a product equal to a boost factor times the difference comparison.

26. The converter of claim 24 wherein the plurality of time periods equals three time periods.

27. The converter of claim 24:
wherein each of the plurality of voltage taps is loaded with an estimated RC load; and
wherein each of the plurality of time periods has a duration relating to the estimated RC load.

28. The converter of claim 27:
wherein the plurality of time periods equals three time periods;
wherein a first of the three time periods has a duration equal to 0.5RC;
wherein a second of the three time periods has a duration equal to 1.0RC; and
wherein a third of the three time periods has a duration equal to 2.5RC.

29. The converter of claim 1 wherein the circuitry for generating the analog output voltage comprises:

circuitry for first coupling a first voltage to charge an output capacitance in response to the difference comparison, wherein the first voltage is selected from a group of taps that are a subset of the plurality of voltage taps;

circuitry for second coupling a second voltage to further charge the output capacitance, wherein the second voltage is provided by a selected one of the plurality of voltage taps; and wherein the analog output voltage is responsive to the first voltage and the second voltage coupled to the output capacitance.

30. The converter of claim 29:

wherein the string of series connected resistive elements form a number of bit lines; and wherein the group of taps has a number of taps equal to half the number of bit lines.

31. The converter of claim 1 wherein the circuitry for generating the analog output voltage generates the analog output voltage in a first instance in response to the comparison circuitry and in a second instance in response to an analog voltage corresponding to the selected one of the plurality of successive digital words.

32. The converter of claim 1:

wherein the earlier received one of the plurality of successive digital words has a first corresponding analog voltage;

wherein the selected one the plurality of successive digital words has a second corresponding analog voltage;

wherein the circuitry for generating the analog output voltage comprises:
circuitry for first coupling a first voltage to charge an output capacitance to a first level in response to the difference comparison;
circuitry for second coupling a second voltage to further charge the output capacitance to a second level, wherein a difference between the second level and the first corresponding analog voltage is less than a difference between the second corresponding analog voltage and the first corresponding analog voltage.

33. The converter of claim 1:

wherein the earlier received one of the plurality of successive digital words has a first corresponding analog voltage;

wherein the selected one the plurality of successive digital words has a second corresponding analog voltage;

wherein the circuitry for generating the analog output voltage comprises:
circuitry for first coupling a first voltage to charge an output capacitance to a first level in response to the difference comparison;
circuitry for second coupling a second voltage to further charge the output capacitance to a second level, wherein a difference between the second level and the first corresponding analog voltage is greater than a difference between the second corresponding analog voltage and the first corresponding analog voltage.

34. A digital to analog converter, comprising:

an input for receiving a plurality of successive digital words;

circuitry for storing the plurality of successive digital words;

a string of series connected resistive elements, wherein the string comprises a plurality of voltage taps;

an output for providing an analog output voltage corresponding to a selected one of the plurality of successive digital words;

comparison circuitry for comparing the selected one and an earlier received one of the plurality of successive digital words;

circuitry for generating the analog output voltage in response to the comparison circuitry by forming a difference comparison by subtracting the earlier received one of the plurality of successive digital words from the selected one of the plurality of successive digital words;

wherein the circuitry for generating the analog output voltage comprises:
circuitry for first coupling a first voltage to charge an output capacitance in response to the difference comparison;
circuitry for second coupling a second voltage to further charge the output capacitance;
circuitry for second coupling a third voltage to further charge the output capacitance;

wherein the analog output voltage is responsive to the first voltage and the second voltage and the third voltage.

35. The converter of claim 34:

wherein the earlier received one of the plurality of successive digital words has a first corresponding analog voltage;

wherein the selected one the plurality of successive digital words has a second corresponding analog voltage;

wherein the first voltage has a first asymptote;

wherein a difference between the first asymptote and the first corresponding analog voltage is greater than a difference between the second corresponding analog voltage and the first corresponding analog voltage;

wherein the second voltage has a second asymptote;

wherein a difference between the second asymptote and the first corresponding analog voltage is greater than a difference between the second corresponding analog voltage and the first corresponding analog voltage;

wherein the difference between the second asymptote and the first corresponding analog voltage is less than the difference between the first asymptote and the first corresponding analog voltage;

wherein the third voltage has a third asymptote;

wherein a difference between the third asymptote and the first corresponding analog voltage is greater than a difference between the second corresponding analog voltage and the first corresponding analog voltage;

wherein the difference between the third asymptote and the first corresponding analog voltage is less than the difference between the second asymptote and the first corresponding analog voltage.

36. The converter of claim 34:

wherein the circuitry for generating first couples the first voltage by selecting a first corresponding voltage at one of the plurality of voltage taps in response to the difference comparison and coupling the first corresponding voltage to an output capacitance for a first time period;

wherein the circuitry for generating second couples the second voltage by selecting a second corresponding voltage at one of the plurality of voltage taps in response to the difference comparison and coupling the second corresponding voltage to the output capacitance for a second time period;

wherein the circuitry for generating third couples the third voltage by selecting a third corresponding voltage at one of the plurality of voltage taps in response to the difference comparison and coupling the third corresponding voltage to the output capacitance for a third time period.

37. The converter of claim 36 wherein the circuitry for generating the analog output voltage comprises circuitry for fourth coupling a fourth voltage to charge the output capacitance, wherein the fourth voltage corresponds to the selected one of the plurality of successive digital words.

38. The converter of claim 36 wherein each of the first time period, second time period, and third time period has a different corresponding duration.

39. The converter of claim 38:
   wherein the corresponding duration of the first time period is greater than the corresponding duration of the second time period; and
   wherein the corresponding duration of the second time period is greater than the corresponding duration of the third time period.

* * * * *